United States Patent
Song et al.

(10) Patent No.: US 6,492,281 B1
(45) Date of Patent: Dec. 10, 2002

(54) METHOD OF FABRICATING CONDUCTOR STRUCTURES WITH METAL COMB BRIDGING AVOIDANCE

(75) Inventors: Shengnian Song, Austin, TX (US); Bradley Davis, Fukushima (JP); Sey-Ping Sun, Austin, TX (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 5 days.

(21) Appl. No.: 09/668,443

(22) Filed: Sep. 22, 2000

(51) Int. Cl.[7] .......................................... H01L 21/302
(52) U.S. Cl. ..................... 438/715; 438/703; 438/720; 438/687; 438/688
(58) Field of Search .................. 438/653, 654, 438/643, 680, 687, 688, 699, 703, 715, 716, 720; 430/503, 509, 515, 578, 529, 584, 126.4, 126.5

(56) References Cited

U.S. PATENT DOCUMENTS

| | | | |
|---|---|---|---|
| 5,300,307 A | | 4/1994 | Frear et al. .................... 427/96 |
| 5,665,659 A | | 9/1997 | Lee et al. .................... 438/646 |
| 5,792,672 A | * | 8/1998 | Chan et al. .................... 438/6 |
| 5,877,086 A | * | 3/1999 | Aruga ....................... 438/653 |
| 5,877,087 A | * | 3/1999 | Mosely et al. .............. 438/656 |
| 5,981,382 A | * | 11/1999 | Konecni et al. ............ 438/646 |
| 5,994,217 A | | 11/1999 | Ng ............................... 438/636 |
| 6,087,266 A | * | 7/2000 | Abraham ................... 438/714 |
| 6,328,815 B1 | * | 12/2001 | Jeng et al. .................... 134/32 |
| 6,372,645 B1 | * | 4/2002 | Liu et al. ..................... 438/688 |
| 6,383,914 B1 | * | 5/2002 | Yasuda ........................ 438/625 |

FOREIGN PATENT DOCUMENTS

| | | | |
|---|---|---|---|
| JP | 2000340570 | 12/2000 | ....... H01L/21/3205 |
| WO | WO-97/12399 | * 4/1997 | ......... H01L/23/495 |

OTHER PUBLICATIONS

Stanley Wolf and Richard N. Tauber; *Silicon Processing for the VLSI Era, vol. 2—Process Integration*; pp. 191, 264, 267, 269 and 271; 1990.

* cited by examiner

*Primary Examiner*—Trung Dang
*Assistant Examiner*—Brook Kebede
(74) *Attorney, Agent, or Firm*—Timothy M. Honeycutt

(57) ABSTRACT

Various methods of inspecting a workpiece for residue are provided. In one aspect, a method of fabricating a conductor layer on a substrate is provided that includes forming an aluminum-copper film on the substrate in a first processing chamber and forming an anti-reflective coating on the aluminum-copper film in a second processing chamber. The substrate is moved from the second processing chamber into a cooling chamber to quench the substrate. A first time interval during which the substrate is in the first processing chamber and second time interval during which the substrate is present in the second processing chamber are measured. The substrate is annealed to restore a uniform equilibrium distribution of copper in the aluminum if the first time interval exceeds about 600 seconds or the second time interval exceeds about 300 seconds. The method substantially reduces the risk of metal comb bridging device failures following etch definition of conductor lines.

20 Claims, 1 Drawing Sheet

METHOD OF FABRICATING CONDUCTOR STRUCTURES WITH METAL COMB BRIDGING AVOIDANCE

BACKGROUND OF THE INVENTION

1. Field of the Invention

This invention relates generally to semiconductor processing, and more particularly to a method of fabricating a conductor layer on a semiconductor workpiece.

2. Description of the Related Art

Most of the interconnections for the numerous individual transistors in a modem integrated circuit are provided via one or more metallization layers that serve as global interconnect levels. Each metallization layer is ordinarily deposited on the substrate of the integrated circuit as a single continuous layer that is thereafter patterned lithographically and etched to remove metal from areas where metal lines are not required.

In addition to the one or more metallization layers, modem integrated circuits also incorporate numerous routing-restricted interconnect levels commonly known as local interconnect ("LI"). LIs are used for short metallization runs such as those that locally interconnect gates and drains in NMOS and CMOS circuits and those that connect a given metallization layer to a particular structure in the integrated circuit.

Aluminum films have been used as interconnect structures in semiconductor processing for decades. The benefits of aluminum as an interconnect material are legion, including relatively low resistivity, low cost and ease of application. Frequently, aluminum interconnect films are provided with a small percentage of copper to provide increased resistance to electromigration. A typical composition may be about 0.5% to 1% copper.

Most global interconnect films are patterned on an interlevel dielectric layer composed of oxide or some other type of insulating material. In one conventional technique, a titanium seed film is first applied to the interlevel dielectric layer to provide seeding sites for the subsequent physical vapor deposition ("PVD") of the aluminum/copper mixture. The titanium seed layer deposition is followed up with the PVD of the bulk aluminum/copper film. Thereafter, an anti-reflective coating composed of titanium nitride is fabricated on the aluminum film. The anti-reflective coating film is applied in order to facilitate the subsequent photolithographic patterning of mask structures fabricated on the ARC film which are used during etching of the aluminum film into desired interconnect line patterns.

Successful etch definition of the various interconnect lines from the bulk deposited aluminum film relies to a certain extent upon a relatively uniform composition in the aluminum film. Accordingly, the conventional PVD process for laying down the aluminum/copper film is tailored to provide the copper atoms in the aluminum matrix in an equilibrium solution. However, if certain events occur during the processing of the wafer following aluminum deposition, the copper atoms in the aluminum matrix may begin to precipitate out and form a copper rich phase in the aluminum film. This copper rich phase in the aluminum layer is generally more resistant to etching processes used to pattern the aluminum film. Accordingly, so-called "metal comb bridging" between adjacent interconnect lines following aluminum etch may appear and result in device shorting and poor yields.

As with many aspects of semiconductor processing, the precipitation of copper atoms in the aluminum matrix is queue dependent. One problematic portion of the post aluminum/copper deposition step is the time interval during which the wafer remains in the titanium nitride deposition chamber. If the wafer remains in the titanium nitride deposition chamber for a long enough time interval, the wafer will undergo a slow cool down process. This slow cool down process can produce the aforementioned copper precipitation and the copper rich phase in the aluminum film. A variety of factors may lead to an unacceptably long resident times in the titanium nitride chamber. In modern semiconductor processing lines, the types of fault events that may disturb the normal process flow are numerous, including such things as downstream tool maintenance, downstream tool failure, and software bugs to name just a few.

The present invention is directed to overcoming or reducing the effects of one or more of the foregoing disadvantages.

SUMMARY OF THE INVENTION

In accordance with one aspect of the present invention, a method of fabricating a conductor layer on a substrate is provided that includes forming an aluminum-copper film on the substrate in a first processing chamber and forming an anti-reflective coating on the aluminum-copper film in a second processing chamber. The substrate is moved from the second processing chamber into a cooling chamber to quench the substrate. A first time interval during which the substrate is in the first processing chamber and second time interval during which the substrate is present in the second processing chamber are measured. The substrate is annealed to restore a uniform equilibrium distribution of copper in the aluminum if the first time interval exceeds about 600 seconds or the second time interval exceeds about 300 seconds.

In accordance with another aspect of the present invention, a method of fabricating a conductor layer on a substrate is provided that includes forming an aluminum-copper film on the substrate in a first processing chamber and forming a titanium nitride anti-reflective coating on the aluminum-copper film in a second processing chamber. The substrate is moved from the second processing chamber into a cooling chamber to quench the substrate. A first time interval during which the substrate is in the first processing chamber and second time interval during which the substrate is present in the second processing chamber are measured. The substrate is annealed to restore a uniform equilibrium distribution of copper in the aluminum if the first time interval exceeds about 600 seconds or the second time interval exceeds about 300 seconds.

In accordance with another aspect of the present invention, a method of fabricating a conductor layer on a substrate using a processing system having a first processing chamber, a second processing chamber, a cooling chamber, a load-lock, and a computer controller is provided. An aluminum-copper film is deposited on the substrate in a first processing chamber. The aluminum-copper film has a copper concentration of about 0.5 to 1.0%. A titanium nitride anti-reflective coating film is formed on the aluminum-copper film in a second processing chamber. The substrate is moved from the second processing chamber into the cooling chamber to quench the substrate. A first time interval during which the substrate is in the first processing chamber and second timer interval during which the substrate is in the second processing chamber are measured with the computer controller. The substrate is annealed to restore a uniform equilibrium distribution of copper in the aluminum if the first time interval exceeds about 600 seconds or the second time interval exceeds about 300 seconds.

BRIEF DESCRIPTION OF THE DRAWINGS

The foregoing and other advantages of the invention will become apparent upon reading the following detailed description and upon reference to the drawings in which.

DETAILED DESCRIPTION OF SPECIFIC EMBODIMENTS

Figure 1:
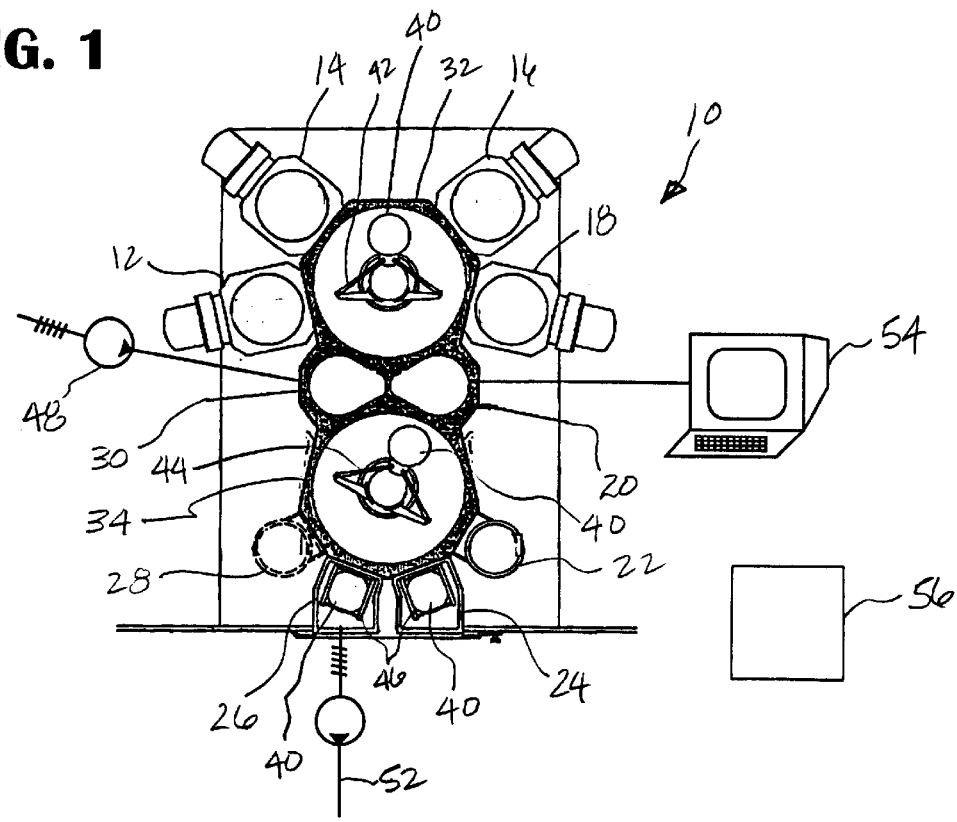
FIG. 1 is a schematic view of an exemplary cluster tool that may be used to fabricate a conductor film on a semiconductor workpiece or substrate in accordance with the present invention.

In the drawings described below, reference numerals are generally repeated where identical elements appear in more than one figure. FIG. 1 depicts a schematic view of an exemplary cluster tool 10 that may be used to fabricate a conductor film on a semiconductor workpiece or substrate in accordance with the present invention. The cluster tool 10 includes a plurality of processing chambers 12, 14, 16, 18, 20, 22, 24, 26, 28 and 30 clustered around a centrally disposed transfer chamber 32 and a buffer chamber 34. The processing chambers 12, 14, 16, 18, 20, 22, 24, 26, 28 and 30 may perform a variety of semiconductor processing functions, such as, for example, physical vapor deposition ("PVD"), chemical vapor deposition, annealing, and cooling to name just a few. In an exemplary embodiment, the processing chambers 12, 14, 16 and 18 are PVD chambers, the processing chamber 20 is a pass-through chamber, the processing chamber 22 is a degassing chamber, the processing chambers 24 and 26 are load-locks, the processing chamber 28 is a wafer orientation chamber and the processing chamber 30 is a cooling chamber. The pass-through chamber 20 provides a transfer conduit between the transfer chamber 32 and the buffer chamber 34.

The transfer chamber 32 and the buffer chamber 34 serve a centralized semiconductor workpiece or wafer transport devices that are operable to move semiconductor workpieces 40 into and out of the various processing chambers 12, 14, 16, 18, 20, 22, 24, 26, 28 and 30. Movement of the workpieces is provided by robots 42 and 44 positioned in the transfer chamber 32 and the buffer chamber 34.

The load-locks 24 and 26 serve as entrance and exit points for the tool 10. Workpieces 40 are housed in cassettes 46 that are placed into one or both of the load-locks. From there, the workpieces are moved into the various chambers for processing. When processing is completed, the workpieces 40 are placed back into the cassettes 46 and the cassettes are withdrawn from the load-locks 24 and 26. Note that the load-lock 26 and the cooling chamber 30 are provided with discrete vacuum pumping systems 48 and 50, respectively. As described below, this arrangement speeds the transfer of workpieces 40 from the cooling chamber 30.

The operation of the transfer chamber 32, the buffer chamber 34 as well as the various processing chambers 12, 14, 16, 18, 20, 22, 24, 26, 28 and 30 is controlled by an equipment interface or computer controller 54 that may be a dedicated controller, a personal computer, or other type of computing device as desired. In an exemplary embodiment, the tool 10 may be an Applied Materials Endura. However, the skilled artisan will appreciate that the various processing steps described below may be performed in other tools as desired. Other than cluster tool technology may be utilized.

An annealing chamber 56 is used to perform remedial annealing of the workpieces 40 as described more fully below. The annealing chamber 56 is depicted as a discrete tool. However, the annealing chamber 56 may be clustered with the tool 10 as desired. Indeed, the type of annealing tool utilized is a matter of design discretion. In an exemplary embodiment, a Novellus Sequel is used.

Figure 2:
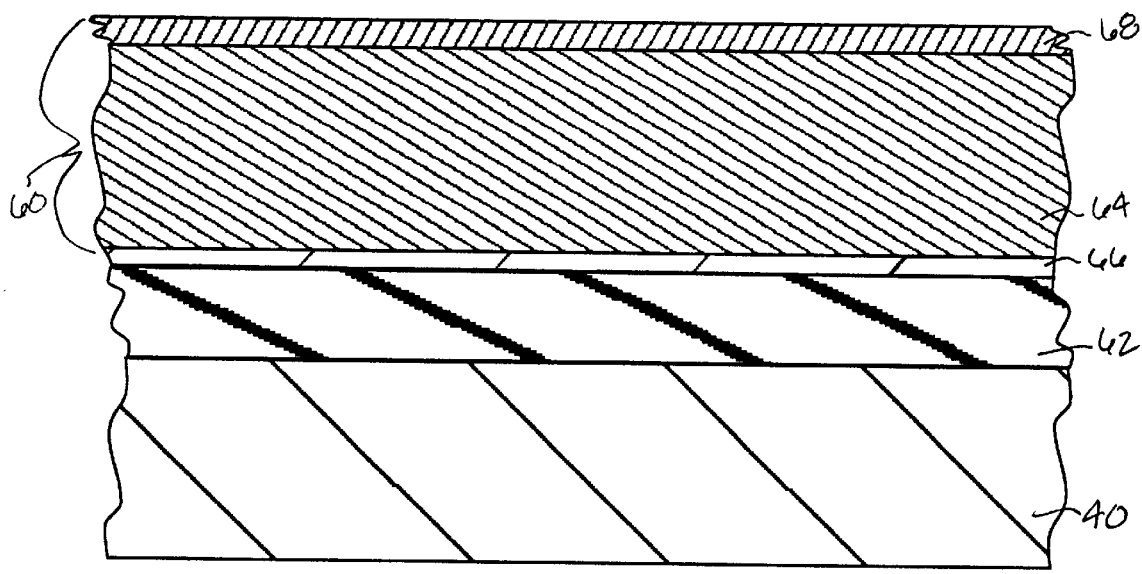
FIG. 2 is a cross-sectional view of semiconductor substrate depicting an exemplary conductor layer formed thereon in accordance with the present invention.

An exemplary process for fabricating a conductor layer on a substrate in accordance with the present invention may be understood by referring now to FIGS. 1 and 2. FIG. 2 is a cross-sectional view of a small portion of one of the semiconductor workpiece or substrates 40 upon which a conductor layer 60 is fabricated. The substrate 40 may be any of variety of substrates used in integrated circuit fabrication, such as, for example, silicon, germanium, silicon-on-insulator or the like. The conductor layer 60 similarly may be any of a myriad of conductor structures used in circuit design, such as, for example, a global interconnect structure, a local interconnect, or a device gate to name just a few. The skilled artisan will appreciate that the conductor film 60 may be positioned at various locations on the substrate 40, that is, on top of various interlevel dielectric films or other types of structures commonly used in semiconductor processing or even in contact with the substrate 40 if desired. In the illustrated embodiment, the conductor layer 60 is formed on an interlevel dielectric layer 62 that may be composed of a variety of insulating materials, such as, for example, tetra-ethyl-ortho-silicate ("TEOS"), boro-phospho-silicate-glass ("BPSG"), silicon dioxide or the like.

The conductor layer 60 is a laminate structure consisting of an aluminum film 64 containing about 0.5% to 1% copper formed on a titanium seed film 66. A titanium nitride anti-reflective coating ("ARC") layer 68 is fabricated on the aluminum film 64, principally to facilitate subsequent photolithographic patterning of the conductor layer 60.

Initially the interlevel dielectric layer 62 is formed on the substrate 40 using any of a variety of well known techniques for establishing TEOS, BPSG, silicon dioxide or the like, such as, for example, CVD, thermal oxidation or the like. The thickness of the film 62 is largely a matter of design discretion. In an exemplary embodiment, the film 62 may be about 2000 to 5000 Å in thickness. The deposition may take place in the cluster tool 10 if one or more of the chambers thereof is configured for oxidation or CVD, or in some other processing tool as desired.

Following fabrication of the interlevel dielectric layer 62, the titanium seed layer 66 is formed thereon using, a variety of methods such as, for example, PVD or CVD. The thickness of the film 66 is largely a matter of design discretion. In an exemplary embodiment, the film 66 is deposited with a thickness of about 250 to 500 Å. If the PVD chamber 12 of the cluster tool 10 is utilized, the workpiece is first moved from one of the load-locks 24 or 26 through the buffer chamber 34, the pass-through chamber 20 and the transfer chamber and into the processing chamber 12.

Next, the workpiece 40 is moved from the titanium PVD chamber 12 into the aluminum PVD chamber 18 and the aluminum film 64 is deposited on the titanium seed layer 66. As noted above, the aluminum film 64 advantageously consists of aluminum with the addition of about 0.5% to 1% copper for increased resistance to electromigration. The thickness of the film 64 is largely a matter of design discretion. In an exemplary embodiment, the film 64 may be formed with a thickness of about 4000 to 8000 Å. The PVD process may be carried out with an argon ambient at about 2 mtorr, a chamber temperature of about 350° C. and a sputter electrode power of about 12,000 watts. The foregoing parameters yield a deposition rate of about 160 Å/sec for aluminum. Higher or lower powers, temperatures and argon pressures may be utilized if desired.

The management of the titanium and aluminum PVD processes is managed by the equipment interface 54. In addition, the equipment interface 54 logs the time interval during which the workpiece 40 is present in the aluminum processing chamber 14.

The workpiece 40 is next moved by the transfer robot 42 from the aluminum PVD chamber 18 to one of PVD chambers 14 or 16. There, the titanium nitride ARC film 68 is applied to the aluminum film 64 by PVD. The PVD process may be carried out about 350° C. and with a sputter electrode power of about 6500 watts. The thickness of the ARC film 36 again is largely a manner of design discretion. In an exemplary embodiment, the ARC film 36 may have a thickness of about 350 to 1000 Å. Optionally, the ARC film 68 may be composed of other commonly used ARC materials, such as, for example, silicon oxynitride, silicon rich nitride or the like.

Again, the equipment interface 54 logs the time interval during which the workpiece 40 is present in the titanium nitride PVD chamber 16. The logging of the resident times in the aluminum processing chamber 18 and the titanium nitride chamber 14 or 16 is vital in avoiding metal comb bridging of the aluminum film 64. Experiment has shown that if the time interval during which the workpiece 40 is present in the titanium nitride PVD chamber 14 or 16 exceeds about 300 seconds, or if the time interval during which the workpiece 40 is present in the aluminum processing chamber 18 exceeds about 600 seconds, the workpiece 40 will undergo a slow cool down that produces copper precipitation in the aluminum film 64. As noted above, this copper rich precipitate exhibits heightened resistance to the various etching processes used to pattern the aluminum film 64 and can lead to metal comb bridging problems. Experiment has shown that the copper precipitation phenomena is dependent upon the aforementioned residence times in the chambers 14 or 16 and 18. However, the problem appears to be independent of the thickness of the film 64.

Accordingly, the equipment interface 54 senses the time intervals during which the workpiece 40 is present in the aluminum chamber 18 and in the titanium nitride deposition chamber 14 or 16. If the workpiece 40 remains in the aluminum chamber for longer that about 600 seconds, or in the titanium nitride chamber 14 or 16 for longer than about 300 seconds, then the equipment interface 54 instructs the tool 10 to move the workpiece 40 into one of the load-locks 24 or 26. From there, the workpiece is transferred to the annealing chamber 56 for a remedial anneal process.

The goal of the remedial anneal process is to dissolve the precipitated copper back into solution in the aluminum film 64. Experiment has shown unexpectedly good results in the elimination of metal comb bridging by performing the remedial anneal at about 375° to 425° C. and advantageously at about 400° C. and for about 180 to 210 seconds. The remedial anneal temperature should be kept low enough to avoid the creation of stress induced hillocks in the aluminum film 32. Immediately after the anneal, the workpiece 40 should be quenched in a cooling chamber to ensure a uniform copper distribution in the aluminum matrix. For example, if the tool 10 is fitted with annealing chamber, the quench may be performed in the cooling chamber 30. The quench may be performed for about 60 seconds in an argon atmosphere with a pressure of about 2 torr. Thereafter, the workpiece 40 may continue through processing toward device completion as normal.

The remedial annealing eliminates the copper precipitation problem, but not at the cost of yield or reliability. Experiment has shown that the remedial annealing does not degrade yields or device reliability.

In contrast, if the equipment interface 54 determines that the workpiece 40 has not or will not remain in the titanium nitride processing chamber 14 or 16 for greater than about 300 seconds, or in the aluminum processing chamber 18 for greater than about 600 seconds, then the workpiece 40 will not be placed on processing-hold and designated for remedial annealing. In this case, the workpiece 40 will be transferred to the cooling chamber 30 for a cooling step prior to transfer into one of the cassettes 46.

One bottle neck in the sequential processing of the workpiece 40 that may lead to undesirably high resident times in the processing chamber 14 or 16 is the time required to pump down the cooling chamber 30. Accordingly, this bottle neck may be substantially eliminated by separately pumping down both the load-lock 26 and the cooling chamber 30 using the discrete pumping systems 48 and 52. In various conventional cluster tool systems, a single pump down system is used to pump down not only the load-lock 26 but also the various tools clustered thereto. Note that one or both of the load-locks 24 or 26 may be separately pumped.

If desired, workpiece orientation may be analyzed in the orientation chamber 28 and degassing may be performed in the degassing chamber 22. Degassing may entail heating in argon or other well known degassing processes.

The skilled artisan will appreciate that the process of the present invention provides for the fabrication of aluminum-copper conductor layers with enhanced resistance to metal comb bridging failures. The problem of queue dependent copper precipitation following titanium nitride anti-reflective coating application is treated proactively. The substrate loitering interval in a titanium nitride processing chamber is measured and compared to an experimentally determined maximum allowable time period. Remedial annealing is performed in lieu of workpiece scrapping.

While the invention may be susceptible to various modifications and alternative forms, specific embodiments have been shown by way of example in the drawings and have been described in detail herein. However, it should be understood that the invention is not intended to be limited to the particular forms disclosed. Rather, the invention is to cover all modifications, equivalents and alternatives falling within the spirit and scope of the invention as defined by the following appended claims.

What is claimed is:

1. A method of fabricating a conductor layer on a substrate, comprising:

forming an aluminum-copper film on the substrate in a first processing chamber;

forming an anti-reflective coating on the aluminum-copper film in a second processing chamber;

moving the substrate from the second processing chamber into a cooling chamber to quench the substrate;

measuring a first time interval during which the substrate is in the first processing chamber and second time interval during which the substrate is present in the second processing chamber; and annealing the substrate to restore a uniform equilibrium distribution of copper in the aluminum if the first time interval exceeds about 600 seconds or the second time interval exceeds about 300 seconds.

2. The method of claim 1, wherein the annealing comprises heating the substrate at about 375 to 425° C. for about 180 to 210 seconds and quenching the substrate.

3. The method of claim 1, wherein the forming of the aluminum-copper film comprises depositing aluminum with a copper concentration of about 0.5 to 1.0%.

4. The method of claim 1, comprising depositing a titanium film prior to forming the aluminum-copper film.

5. The method of claim 1, wherein the measuring of the first time interval and the second time interval is performed by a computer.

6. The method of claim 1, wherein the aluminum-copper film and the anti-reflective coating are formed by physical vapor deposition.

7. A method of fabricating a conductor layer on a substrate, comprising:

forming an aluminum-copper film on the substrate in a first processing chamber;

forming a titanium nitride anti-reflective coating on the aluminum-copper film in a second processing chamber;

moving the substrate from the second processing chamber into a cooling chamber to quench the substrate;

measuring a first time interval during which the substrate is in the first processing chamber and second time interval during which the substrate is present in the second processing chamber; and annealing the substrate to restore a uniform equilibrium distribution of copper in the aluminum if the first time interval exceeds about 600 seconds or the second time interval exceeds about 300 seconds.

8. The method of claim 7, wherein the annealing comprises heating the substrate at about 375 to 425° C. for about 180 to 210 seconds and quenching the substrate.

9. The method of claim 7, wherein the forming of the aluminum-copper film comprises depositing aluminum with a copper concentration of about 0.5 to 1.0%.

10. The method of claim 7, comprising depositing a titanium film prior to forming the aluminum-copper film.

11. The method of claim 7, wherein the measuring of the first time interval and the second time is performed by a computer.

12. The method of claim 7, wherein the aluminum-copper film and the titanium nitride film are formed by physical vapor deposition.

13. The method of claim 7, wherein the cooling chamber contains argon.

14. A method of fabricating a conductor layer on a substrate using a processing system having a first processing chamber, a second processing chamber, a cooling chamber, a load-lock, and a computer controller, comprising:

depositing an aluminum-copper film on the substrate, the aluminum-copper film having a copper concentration of about 0.5 to 1.0% in a first processing chamber;

forming a titanium nitride anti-reflective coating film on the aluminum-copper film in a second processing chamber;

moving the substrate from the second processing chamber into the cooling chamber to quench the substrate;

measuring a first time interval during which the substrate is in the first processing chamber and second time interval during which the substrate is in the second processing chamber with the computer controller; and annealing the substrate to restore a uniform equilibrium distribution of copper in the aluminum if the first time interval exceeds about 600 seconds or the second time interval exceeds about 300 seconds.

15. The method of claim 14 wherein the annealing comprises heating the substrate at about 375 to 425° C. for about 180 to 210 seconds and quenching the substrate.

16. The method of claim 14, comprising depositing a titanium film prior to forming the aluminum-copper film.

17. The method of claim 14, wherein the load-lock and the cooling chamber are each separately pumped below atmospheric pressure.

18. The method of claim 14, wherein the aluminum-copper film and the titanium nitride film are formed by physical vapor deposition.

19. The method of claim 14, wherein the movements between the first and second processing chambers and the cooling chamber are controlled by the computer controller.

20. The method of claim 14, wherein the cooling chamber contains argon.

* * * * *